United States Patent
Cheon et al.

(10) Patent No.: US 11,205,768 B2
(45) Date of Patent: *Dec. 21, 2021

(54) METHOD FOR MANUFACTURING OF DISPLAY DEVICE

(71) Applicant: Samsung Display Co., Ltd., Yongin-si (KR)

(72) Inventors: Beomjun Cheon, Asan-si (KR); Kyungsik Kim, Suwon-si (KR); Yun-seok Eo, Hwaseong-si (KR); Sang-geun Lee, Cheonan-si (KR); Seungkuk Lee, Asan-si (KR); Sehee Lim, Bucheon-si (KR); Jinsoo Choi, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/823,934

(22) Filed: Mar. 19, 2020

(65) Prior Publication Data

US 2020/0220117 A1  Jul. 9, 2020

Related U.S. Application Data

(63) Continuation of application No. 15/973,302, filed on May 7, 2018, now Pat. No. 10,608,209.

(30) Foreign Application Priority Data

Sep. 15, 2017  (KR) .................. 10-2017-0118868

(51) Int. Cl.
*H01L 51/56* (2006.01)
*H01L 51/00* (2006.01)
(Continued)

(52) U.S. Cl.
CPC ........ *H01L 51/56* (2013.01); *H01L 21/67092* (2013.01); *H01L 21/67259* (2013.01);
(Continued)

(58) Field of Classification Search
CPC . H01L 22/30–34; H01L 23/544; H01L 22/12; H01L 2223/54426; H01L 27/3276
See application file for complete search history.

(56) References Cited

U.S. PATENT DOCUMENTS 6,825,911 B2  11/2004  Lee et al.
7,938,051 B2  5/2011  Tannas
(Continued)

FOREIGN PATENT DOCUMENTS

JP  H06-281943 A  10/1994
JP  2004-212931  7/2004
(Continued)

OTHER PUBLICATIONS

Notice of Allowance in corresponding Korean Patent Application No. 10-2017-0118868, Korean Notice of Allowance dated Aug. 1, 2021 (5 pgs.).

*Primary Examiner* — Sonya McCall-Shepard
(74) *Attorney, Agent, or Firm* — Lewis Roca Rothgerber Christie LLP

(57) ABSTRACT

A method for manufacturing a display device is provided. A process of forming an inspection pattern, in which a protective film unit is partially removed in a thickness direction, in a pad area portion of the protective film unit, which corresponds to a pad area of a display unit, may be performed, and then, a process of delaminating the pad area portion of the protective film unit may be performed. A process of checking whether the inspection pattern exists may be performed to check whether the delamination has succeeded, and, at the same time, a process of measuring (Continued)

distances from an alignment mark to each of a long side and a short side of the display unit may be performed.

16 Claims, 14 Drawing Sheets

(51) Int. Cl.
*H01L 23/544* (2006.01)
*H01L 27/32* (2006.01)
*H01L 51/52* (2006.01)
*H01L 21/67* (2006.01)
*H01L 21/66* (2006.01)
*H01L 21/78* (2006.01)
*G09G 3/00* (2006.01)

(52) U.S. Cl.
CPC ........ *H01L 23/544* (2013.01); *H01L 27/3276* (2013.01); *H01L 51/0031* (2013.01); *H01L 51/5253* (2013.01); *G09G 3/006* (2013.01); *H01L 22/12* (2013.01); *H01L 2223/5448* (2013.01); *H01L 2223/54426* (2013.01); *H01L 2227/323* (2013.01); *H01L 2251/558* (2013.01); *H01L 2251/566* (2013.01)

(56) References Cited

U.S. PATENT DOCUMENTS

| | | | |
|---|---|---|---|
| 8,841,150 | B2 | 9/2014 | Kim |
| 8,860,035 | B2 | 10/2014 | Bae et al. |
| 8,885,138 | B2 | 11/2014 | Tannas, Jr. |
| 8,991,463 | B2 | 3/2015 | Jeong et al. |
| 2013/0249877 | A1 | 9/2013 | Choi et al. |
| 2015/0255527 | A1 | 9/2015 | Oooka et al. |
| 2017/0033758 | A9 | 2/2017 | Sekiya et al. |
| 2017/0338273 | A1* | 11/2017 | Fujiwara .................. H01L 21/78 |
| 2019/0326336 | A1* | 10/2019 | Xi .......................... H01L 23/544 |

FOREIGN PATENT DOCUMENTS

| | | |
|---|---|---|
| KR | 10-2014-0015038 A | 2/2014 |
| KR | 10-2014-0031005 A | 3/2014 |
| KR | 10-2014-0045837 A | 4/2014 |
| KR | 10-2014-0064553 A | 5/2014 |

\* cited by examiner

METHOD FOR MANUFACTURING OF DISPLAY DEVICE

CROSS-REFERENCE TO RELATED APPLICATIONS

This application is a continuation of U.S. patent application Ser. No. 15/973,302, filed on May 7, 2018, which claims priority to and the benefit of Korean Patent Application No. 10-2017-0118868, filed on Sep. 15, 2017 in the Korean Intellectual Property Office, the entire content of each of which is hereby incorporated by reference.

BACKGROUND

1. Field

Aspects of embodiments of the present disclosure relate to a method for manufacturing a display device.

2. Description of the Related Art

In recent years, various kinds of panels are being used in a field of manufacturing a display device, such as a liquid crystal display (LCD), an organic light emitting diode (OLED), and a touch screen panel (TSP).

During such a manufacturing process, the process is performed while moving to various spaces. A protective film is attached onto a surface of a display device to prevent the surface of the display device from being polluted or damaged while moving the display device to another space, and such a protective film is necessarily removed in a process of connecting inner wires or pads. Accordingly, a device for delaminating the protective film attached to a surface of a panel is being suggested.

A contact-type inspection using a method of applying a pressure on a pad part is performed to inspect whether delamination has occurred after the process of delaminating the protective film attached to the pad part area of the display device, and, during this process, a crack may be generated in the pad part due to an error of a pressure sensor.

SUMMARY

According to an aspect of embodiments of the present disclosure, a method for manufacturing a display device is provided, by which an inspection of whether a pad part of a display substrate is delaminated is easily performed.

According to another aspect of embodiments of the present disclosure, a method for manufacturing a display panel is provided, by which a failure of the display panel may be prevented during a manufacturing process.

According to one or more embodiments of the inventive concept, a method for manufacturing a display device includes: providing a work panel including a work substrate including a plurality of display units each including a display area and a pad area, and a work protective film attached onto the work substrate; separating a plurality of display panels from the work panel, each including a display unit of the plurality of display units and a protective film unit of the work protective film overlapping on the display unit on a plane; forming a cutting line in the protective film unit so as to correspond to a boundary between the display area and the pad area; forming an inspection pattern, in which the protective film unit is partially removed in a thickness direction, in a pad film area portion of the protective film unit, which corresponds to the pad area of the display unit; delaminating the pad area portion of the protective film unit along the cutting line; and checking whether the inspection pattern exists in the pad film area of the display unit.

In an embodiment, the pad area may include a plurality of wires and a plurality of alignment marks, and the inspection pattern may overlap at least one of the plurality of alignment marks.

In an embodiment, the inspection pattern may overlap at least one of the plurality of wires.

In an embodiment, the plurality of alignment marks may be formed on a same layer as that of a wire of the plurality of wires.

In an embodiment, the method may further include measuring distances from an alignment mark of the plurality of alignment marks to each of a long side and a short side of the display unit.

In an embodiment, measuring distances from the alignment mark to each of the long side and the short side of the display unit and checking whether the inspection pattern exists may be performed at the same time.

In an embodiment, an adhesive layer may be between the protective film unit and the display unit, and wherein the cutting line is formed by completely removing the protective film unit in a thickness direction of the display panel to expose the adhesive layer to the outside.

In an embodiment, the adhesive layer exposed to the outside by the cutting line may have a thickness of 25 μm to about 40 μm.

In an embodiment, the display unit may include a base substrate, a circuit element layer, a display element layer, and a thin-film encapsulation layer, which are sequentially laminated.

In an embodiment, the method may further include a work protective film attached to a bottom surface of the work panel.

According to one or more embodiments of the inventive concept, a method for manufacturing a display device includes: providing a display unit including a display area and a pad area; attaching a protective film unit including a first area and a second area respectively corresponding to the display area and the pad area onto the display unit; forming a cutting line so as to correspond to a boundary between the first area and the second area; forming an inspection pattern, in which the protective film unit is partially removed in a thickness direction, on the second area of the protective film; delaminating the protective film unit corresponding to the second area along the cutting line; and checking whether the inspection pattern exists on the pad area.

In an embodiment, the pad area may include a plurality of alignment marks, and the inspection pattern may overlap at least one of the plurality of alignment marks.

In an embodiment, the method may further include measuring distances from the at least one alignment mark to each of a long side and a short side of the display unit.

In an embodiment, measuring distances from the at least one alignment mark to each of the long side and the short side of the display unit and checking whether the inspection pattern exists may be performed at the same time.

In an embodiment, the pad area may include a plurality of wires, and the inspection pattern may overlap at least one of the plurality of wires.

In an embodiment, an adhesive layer may be between the protective film unit and the display unit, and wherein the cutting line is formed by completely removing the protective film unit in a thickness direction of the display panel to expose the adhesive layer to the outside.

In an embodiment, the display unit may include a base substrate, a circuit element layer, a display element layer, and a thin-film encapsulation layer, which are sequentially laminated.

According to one or more embodiments of the inventive concept, an equipment for manufacturing a display device includes: a laser device configured to form an inspection pattern by cutting a work substrate and a work protective film attached onto the work substrate and separating the same into a plurality of display units each including a display area and a pad area and protective film units respectively attached to the plurality of display units and comprising a first area and a second area, each of which overlaps the display area and the pad area on a plane, completely removing the protective film unit in a thickness direction in an area corresponding to a boundary between the first area and the second area to form a cutting line, and partially removing the protective film unit in a thickness direction in an area corresponding to the second area; a delamination device configured to remove the protective film unit corresponding to the second area along the cutting line, wherein the pad area includes a plurality of alignment marks; an inspection device configured to recognize the alignment marks and determine whether the inspection pattern exists; and a control device electrically connected to the laser device, the delamination device, and the inspection device to control the laser device, the delamination device, and the inspection device.

In an embodiment, the laser device may irradiate lasers having intensities different from each other to at least one of separate the protective film unit, form the cutting line, or form the inspection pattern.

In an embodiment, the inspection device may include a camera module and concurrently recognize the alignment marks and whether the inspection pattern exists through the camera module.

BRIEF DESCRIPTION OF THE FIGURES

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

Figure 1:
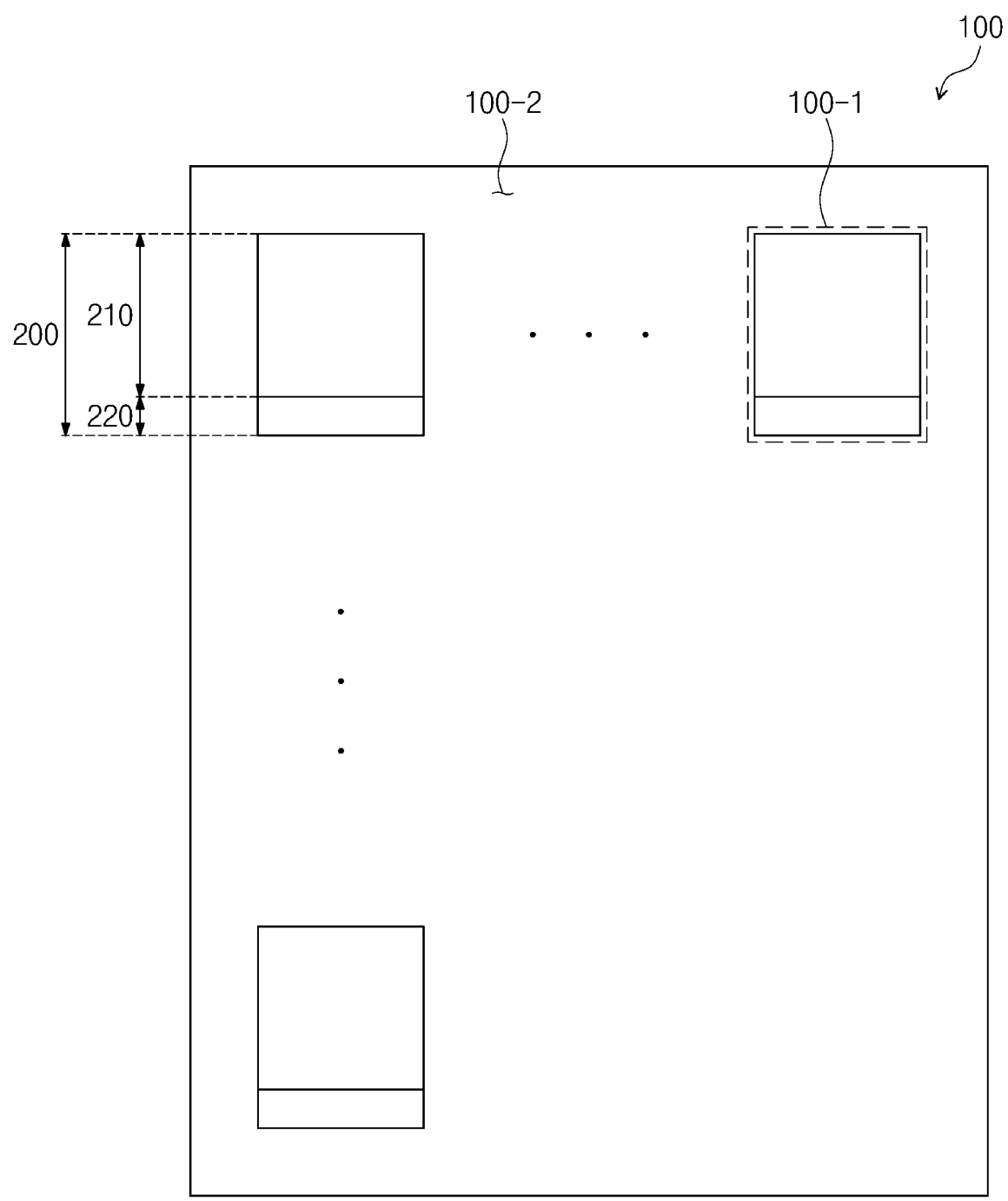
FIG. 1 is a plan view illustrating a process of providing a work substrate according to an embodiment of the inventive concept.

Like reference numerals refer to like elements throughout. Also, in the figures, the dimensions of components may be exaggerated for clarity of illustration. As used herein, the term "and/or" includes any and all combinations of one or more of the associated listed items.

It is to be understood that although the terms "first" and "second" are used herein to describe various elements, these elements should not be limited by these terms. Rather, these terms are used to distinguish one component from other components. For example, without departing from the scope of the present invention, a "first" element could be termed a "second" element, and, similarly, a "second" element could be termed a "first" element. The terms of a singular form may include plural forms unless described to the contrary.

Also, spatially relative terms, such as "below," "lower," "above," and "upper," may be used herein for ease of description to describe an element and/or a feature's relationship to another element(s) and/or feature(s) as illustrated in the drawings. The terms may be a relative concept and described based on directions expressed in the drawings.

The meaning of "include" or "comprise" specifies a property, a region, a fixed number, a step, a process, an element, and/or a component, but does not exclude other properties, regions, fixed numbers, steps, processes, elements, and/or components.

A method for manufacturing a display device according to one or more embodiments of the inventive concept includes: a process of providing a work panel including a work substrate including a plurality of display units each including a display area and a pad area, and a work protective film attached onto the work substrate, a process of separating a plurality of display units from the work panel, each including a display unit of the plurality of display units and a protective film unit of the work protective film corresponding to the display unit, a process of forming a cutting line in the protective film so as to correspond to a boundary between the display area and the pad area, a process of forming an inspection pattern in which the protective film unit in a pad area portion of the protective film unit, which corresponds to the pad area of the display unit, is partially removed in a thickness direction, a process of delaminating the pad area portion of the protective film unit along the cutting line, and a process of checking whether the inspection pattern exists on the pad area of the display unit. Herein, a method for manufacturing a display device will be described with reference to FIGS. 1 to 11.

Figure 2:
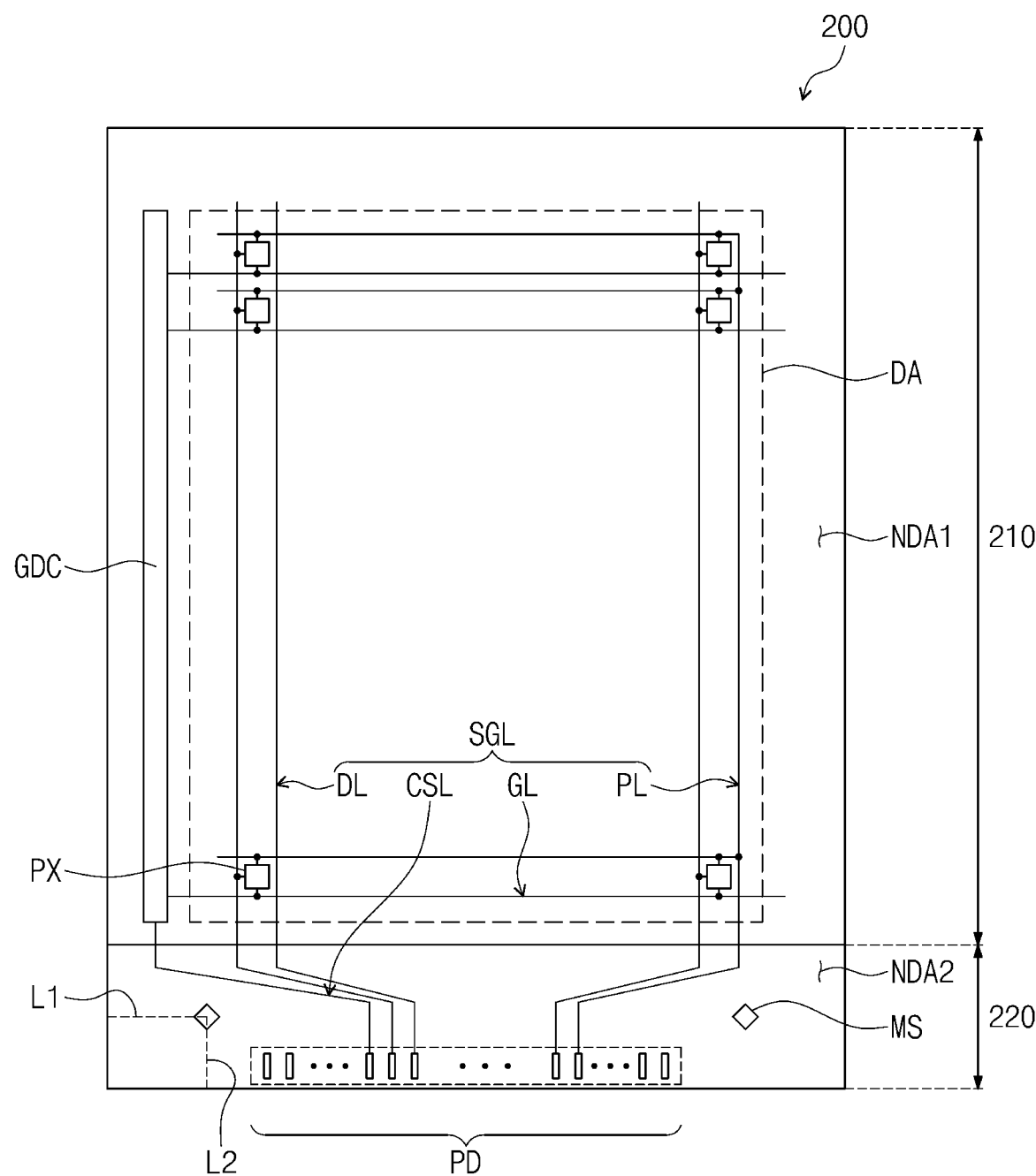
FIG. 2 is a plan view of a display unit according to an embodiment of the inventive concept.
Figure 3:
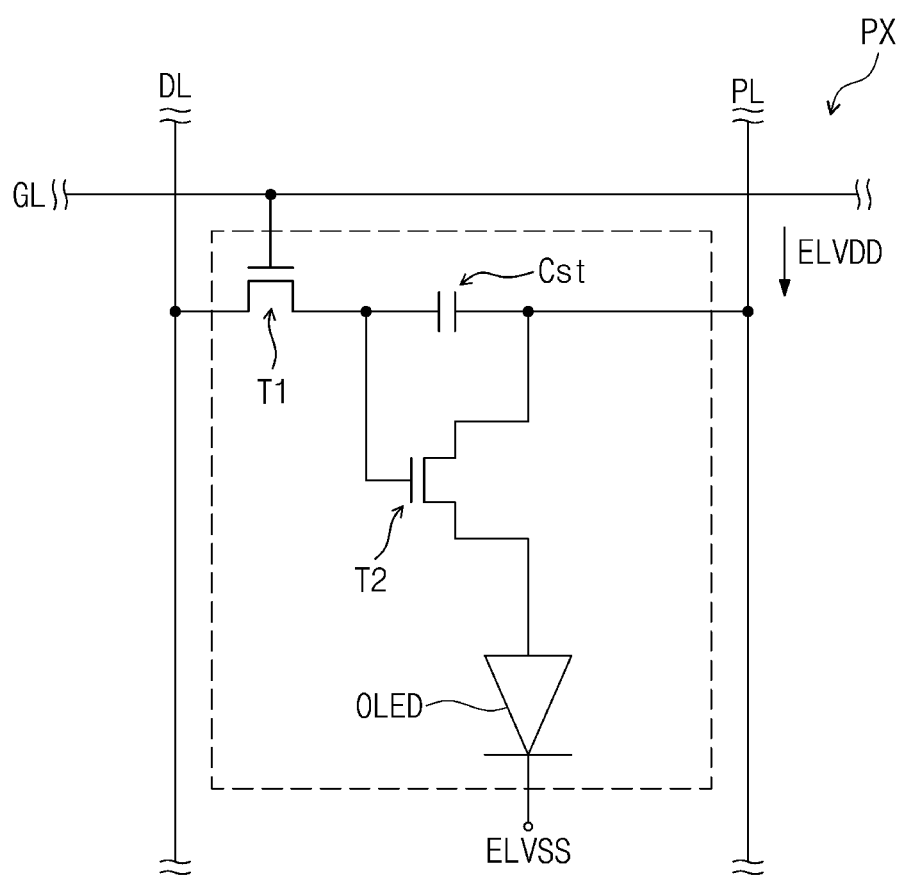
FIG. 3 is an equivalent circuit diagram of a pixel according to an embodiment of the inventive concept.

FIG. 1 is a plan view illustrating a process of providing a work substrate according to an embodiment of the inventive concept; FIG. 2 is a plan view of a display unit according to an embodiment of the inventive concept; and FIG. 3 is an equivalent circuit diagram of a pixel according to an embodiment of the inventive concept. Referring to FIGS. 1 to 3, a process of providing a work substrate including a plurality of display units will be described.

As illustrated in FIG. 1, a work substrate 100 includes a plurality of display units 200.

The work substrate 100 is defined by an active area 100-1 on which a plurality of display areas are formed and a non-active area 100-2 that is a portion except for the active area 100-1. The active area 100-1 of the work substrate 100 may be an area on which a plurality of display units 200 are formed through any of processes, such as deposition, patterning, thin-film formation, and etching, and, in an embodiment, the plurality of display units 200 may be provided at a same time by using a same process.

Each of the display units 200 includes a display area 210 and a pad area 220. The display unit 200 may be provided in plurality, and the plurality of display units 200 may be spaced apart from each other and arranged on the work substrate 100.

One display unit 200 will be described with reference to FIGS. 2 and 3. FIG. 2 illustrates a planar displacement relationship between wires SGL and pixels PX, which are included in the display unit 200.

As illustrated in FIG. 2, the display area 210 of the display unit 200 includes a pixel area DA and first and second surrounding areas NDA1, NDA2 on a plane. In an embodiment, the first surrounding area NDA1 may be defined along an edge of the pixel area DA.

Each of the display units 200 may include a driving circuit GDC, a plurality of wires SGL (herein, referred to as "wires"), a plurality of signal pads PD (herein, referred to as "signal pads"), and a plurality of pixels PX (herein, referred to as "pixels"). The pixels PX are disposed on the pixel area DA. In an embodiment, each of the pixels PX includes an organic light emitting diode OLED and a pixel driving circuit connected thereto. The driving circuit GDC, the wires SGL, and the pixel driving circuit may be included in a pixel element layer CL (see FIG. 5) that will be described later.

The driving circuit GDC may include a scan driving circuit. The scan driving circuit generates a plurality of scan signals (herein, referred to as "scan signals") and sequentially outputs the scan signals to a plurality of scan lines GL (herein, referred to as "scan lines"). The scan driving circuit may further output another control signal to a driving circuit of each of the pixels PX.

The scan driving circuit may include a plurality of thin-film transistors (herein, referred to as "transistors") formed through a same process as that of the driving circuit, e.g., a low temperature polycrystalline silicon (LTPS) process or a low temperature polycrystalline oxide (LTPO) process.

In an embodiment, the wires SGL includes scan lines GL, data lines DL, a power line PL, and a control signal line CSL. Each of the scan lines GL is connected to a corresponding pixel PX of the pixels PX, and each of the data lines DL is connected to the corresponding pixel PX of the pixels PX. The power line PL is connected to the pixels PX. The control signal line CSL may provide control signals to the scan driving circuit.

Figure 5:
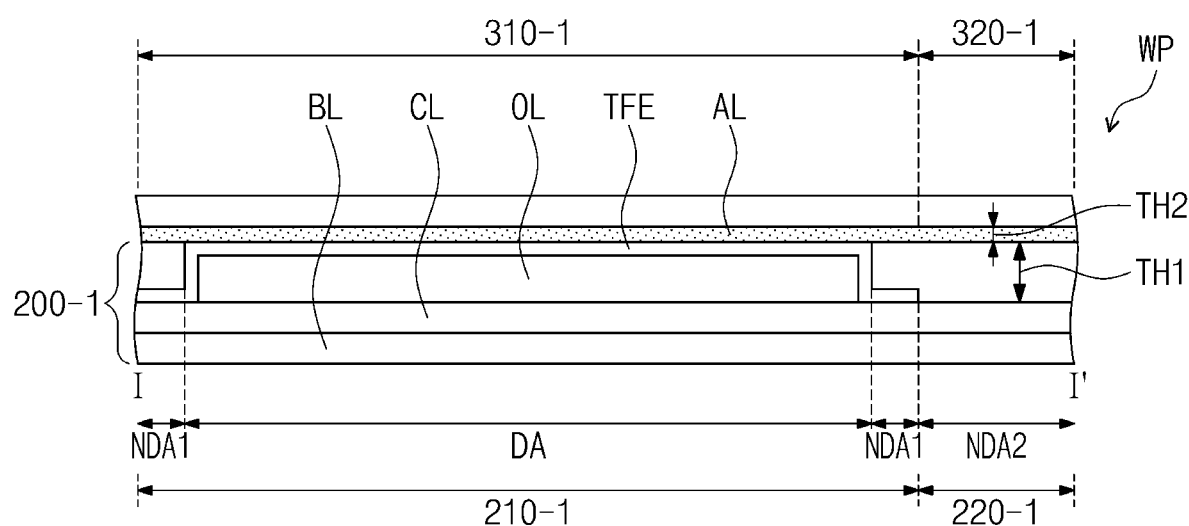
FIG. 5 is a cross-sectional view of a display unit, taken along the line I-I' of FIG. 4, according to an embodiment of the inventive concept.

The wires SGL overlap the pixel area DA, the surrounding area NDA1, and a non-display area NDA2 (see FIG. 5). Each of the signal pads PD is connected to a corresponding wire SGL of the wires SGL.

Substantially, a line part constitutes most of the wires SGL and is connected to the pixel PX. The line part is connected to transistors T1 and T2 (see FIG. 3) of the pixel PX. The line part may have a single layer or multi-layer structure and include a single body or two or more portions. The two or more portions may be disposed on layers different from each other and connected to each other through a contact hole (not shown) passing through an insulation layer (not shown) disposed between the two or more portions.

The pad area 220 includes a plurality of alignment marks MS. In an embodiment of the inventive concept, the alignment marks MS are disposed on mutually corresponding positions of both ends of the pad area 220, but the inventive concept is not limited thereto. The alignment mark MS is located at a first distance L1 and a second distance L2, respectively, from a long side and a short side of the display unit 200. In an embodiment, the alignment mark MS may be formed in a process of patterning the wires SGL. In an embodiment, the alignment mark MS may be formed in a same layer as that of one of the wires SGL, and, in an exemplary embodiment, may be formed in a same layer as that of an uppermost wire of the wires SGL.

FIG. 3 exemplarily illustrates one pixel PX of the plurality of pixels PX, which is connected to one scan line GL, one data line DL, and the power line PL.

The pixel PX that is a pixel driving circuit for driving an organic light emitting diode OLED includes a first transistor T1 (or a switching transistor), a second transistor T2 (or a driving transistor), and a capacitor Cst. A first power voltage ELVDD is provided to the second transistor T2, and a second power voltage ELVSS is provided to the organic light emitting diode OLED. The second power voltage ELVSS may be less than the first power voltage ELVDD.

The first transistor T1 outputs a data signal applied to the data line DL in response to a scan signal applied to the scan line GL.

The capacitor Cst charges a voltage corresponding to a data signal received from the first transistor T1.

The second transistor T2 is connected to the organic light emitting diode OLED. The second transistor T2 controls a driving current flowing through the organic light emitting diode OLED in correspondence to a charge amount stored in the capacitor Cst.

The organic light emitting diode OLED may be a front light emitting diode or a rear light emitting diode. Also, the organic light emitting diode OLED includes an organic light emitting layer disposed between a first electrode (not shown) and a second electrode (not shown). The organic light emitting diode OLED emits light during a turn-on section of the second transistor T2. However, embodiments of the inventive concept are not limited to the above-described constitution of the pixel PX. For example, the pixel PX may have any of various constitutions.

Although the display element is described as an organic light emitting display element in this embodiment, the display element may include a liquid crystal cell, an electrophoretic element, or an electrowetting element, for example.

Figure 4:
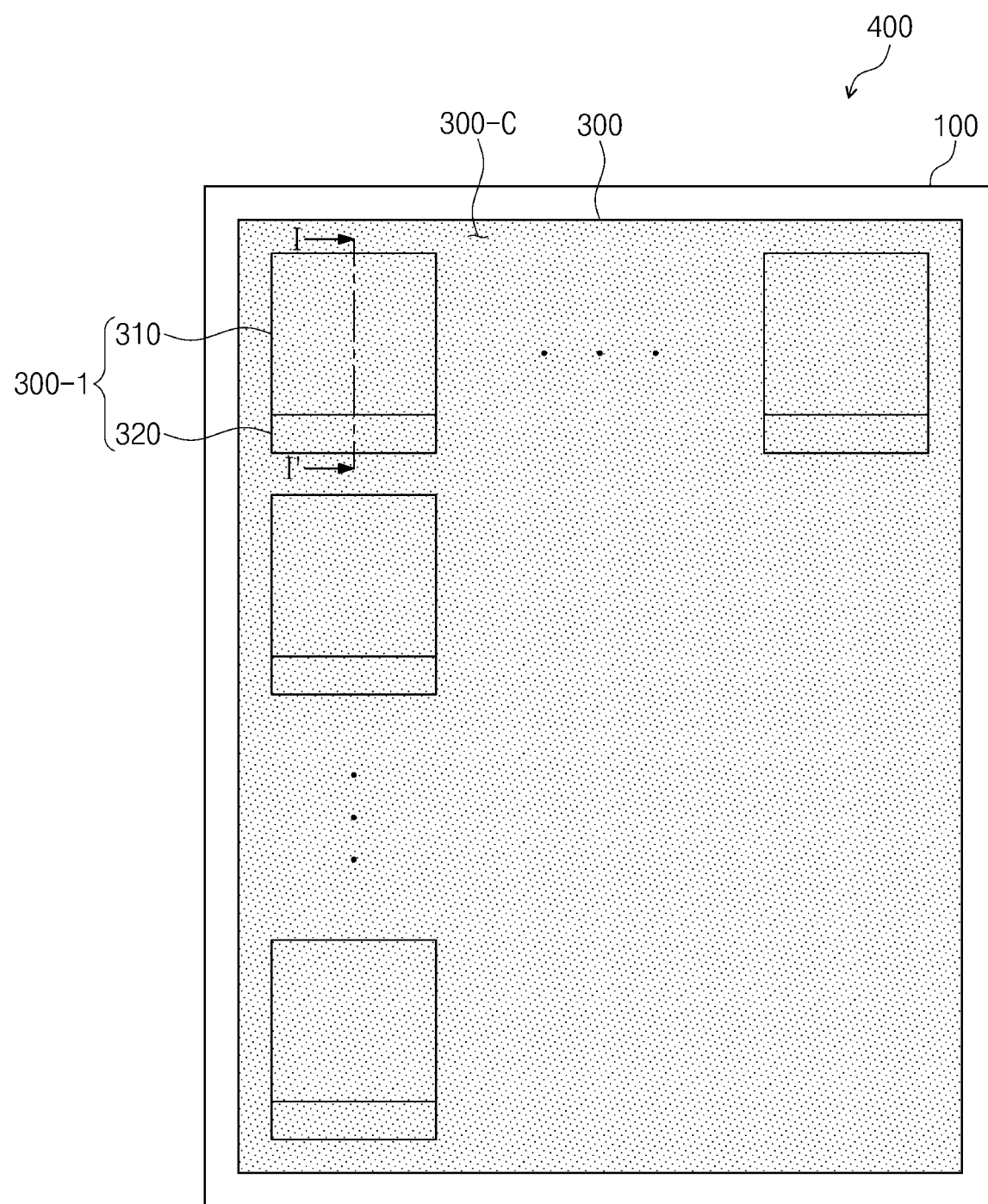
FIG. 4 is a plan view illustrating a process of attaching a work protective film according to an embodiment of the inventive concept.

FIG. 4 is a plan view illustrating a process of attaching a work protective film according to an embodiment of the inventive concept; and FIG. 5 is a cross-sectional view of a work panel, taken along the line I-I' of FIG. 4, according to an embodiment of the inventive concept.

A work protective film 300 includes a protective film unit 300-1 and a non-active film area 300-C respectively corresponding to the active area 100-1 and the non-active area 100-2 (see FIG. 1).

The protective film unit 300-1 includes a display film area 310 and a pad film area 320 respectively corresponding to the display area 210 and the pad area 220 of the display unit 200 (see FIG. 1).

The work protective film 300 is attached onto the work substrate 100 on which the display units 200 are formed. Accordingly, a work panel 400 is provided in which the work protective film 300 is attached onto the work substrate 100.

The work protective film 300 may prevent or substantially prevent external moisture or foreign substances from being introduced into the plurality of display units 200 or prevent or substantially prevent a crack from being generated during a process. In an embodiment, the work protective film 300 may be formed of a material having flexibility, e.g., a polymer resin.

FIG. 5 is a cross-sectional view illustrating one display panel WP in which the protective film unit 300-1 is attached to one display unit 200-1.

The display panel WP includes a display unit 200-1 and a protective film unit 300-1 that overlaps the display unit 200-1 in a plane.

A protective film unit 300-1, including a display film area 310-1 and a pad film area 320-1, may be coupled to an uppermost layer of a display unit 200-1 through an adhesive layer AL. In an embodiment, the uppermost layer of the display unit 200-1 may have a stepped portion depending on an area.

In an embodiment, the adhesive layer AL may have an adhesion force of a top surface to which the protective film unit 300-1 is attached, which is greater than that of a bottom surface to which a thin-film encapsulation layer TFE is attached, such that the adhesive layer AL may be easily removed from the display unit 200-1.

In an embodiment, an empty space having a first thickness TH1 may be formed between the adhesive layer AL and the pad area 220-1. Since a display element layer OL is not deposited on the pad area 220-1, a stepped portion is generated in the pad area 220-1, such that the empty space having the first thickness TH1 is formed. The circuit element layer CL is patterned in the pad area 220-1 to form the wires SGL (see FIG. 2), and, then, the adhesive layer AL and the protective film unit 300-1 are laminated thereon.

In an embodiment, the adhesive layer AL has a second thickness TH2 of about 50 µm to about 75 µm, and the first thickness TH1 is about 30 nm to about 70 nm, such that a flat surface shape of the work protective film 300 is not affected by the empty space. For purposes of illustration, the first thickness TH1 is shown enlarged more than that of the protective film unit 300-1.

In an embodiment, the display unit 200-1 includes a base layer BL, a circuit element layer CL disposed on the base layer BL, a display element layer OL, a thin-film encapsulation layer TFE, an adhesive layer AL, and the protective film unit 300-1. Although not shown, the display unit 200-1 may further include functional layers such as a reflection protection layer and a refractive index adjusting layer.

In an embodiment, the base layer BL may include a synthetic resin film. A synthetic resin layer is formed on the work substrate 100 (see FIG. 1) used for manufacturing the display unit 200-1. Thereafter, a conductive layer, an insulation layer, and the like are formed on the synthetic resin layer. Although the synthetic resin layer may include a polyimide-based resin layer, an embodiment of the inventive concept is not limited to a particular material of the synthetic resin layer. For example, the base layer BL may include a glass substrate, a metal substrate, and/or an organic/inorganic composite substrate.

The circuit element layer CL includes at least one intermediate insulation layer and a circuit element. In an embodiment, the intermediate insulation layer includes at least one inorganic intermediate layer and at least one organic intermediate layer. The circuit element includes a driving circuit GDC and the wires SGL (see FIG. 2), and the pixel driving circuit.

In an embodiment, the pixel element layer CL may be formed through a process of forming an insulation layer and a conductive layer by using a coating or deposition process and a process of patterning a conductive layer and/or a semiconductor layer by using a photolithography process, but is not limited thereto.

The display element layer OL includes a light emitting element. The display element layer OL may include organic light emitting diodes. The display element layer OL may further include a pixel defining layer and an organic layer.

The thin-film encapsulation layer TFE seals the display element layer OL. The thin-film encapsulation layer TFE includes at least one insulation layer. The thin-film encapsulation layer TFE according to an embodiment of the inventive concept may include at least one inorganic layer (herein, referred to as an "encapsulation inorganic layer").

The encapsulation inorganic layer protects the display element layer OL, and an encapsulation organic layer protects the display element layer OL from foreign substances such as dust particles. In an embodiment, the encapsulation inorganic layer may include a silicon nitride layer, a silicon oxynitride layer, a silicon oxide layer, a titanium oxide layer, or an aluminum oxide layer. Although the encapsulation organic layer may include an acrylic-based organic layer, embodiments of the inventive concept are not limited thereto.

Figure 6:
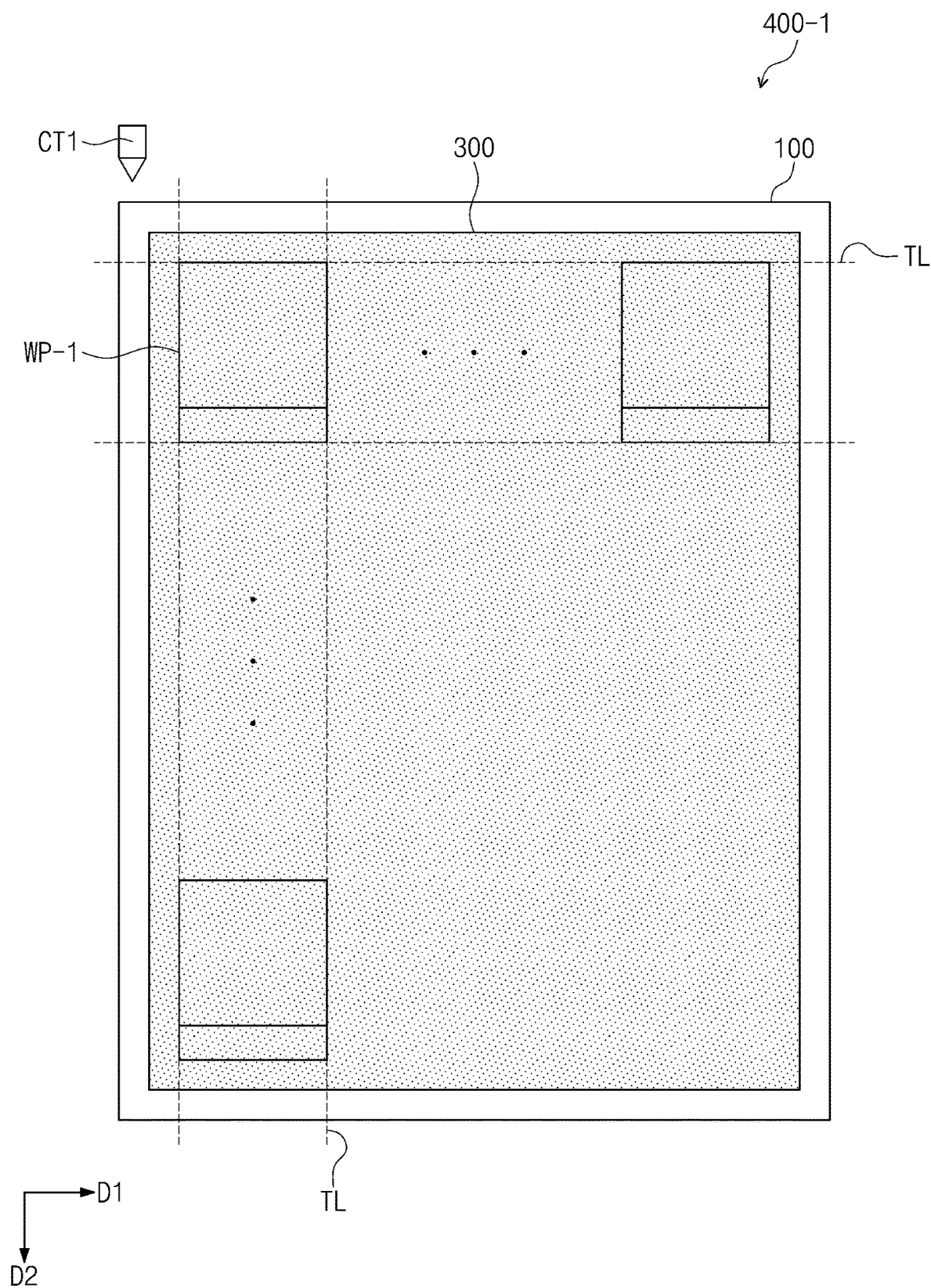
FIG. 6 is a plan view illustrating a process of separating a plurality of display panels from the work panel according to an embodiment of the inventive concept.

FIG. 6 is a plan view illustrating a process of separating individual display panels from the work panel. A first device CT1 is used to cut the work panel 400-1 into an individual display panel WP-1 corresponding to the active area 100-1 (see FIG. 1). The first device CT1 may cut the display panel WP-1 while moving in first and second directions D1 and D2 along a cutting line TL formed on an edge of the display panel WP-1. Accordingly, the plurality of display units formed on the work panel 400-1 is separated into the one or more individual display units 200-1. For example, the first device CT1 may irradiate a laser to cut the work panel 400-1. Although not shown, in an embodiment, the first device CT1 may include a laser oscillation part, a laser optical part, and a laser collecting part.

Figure 7:
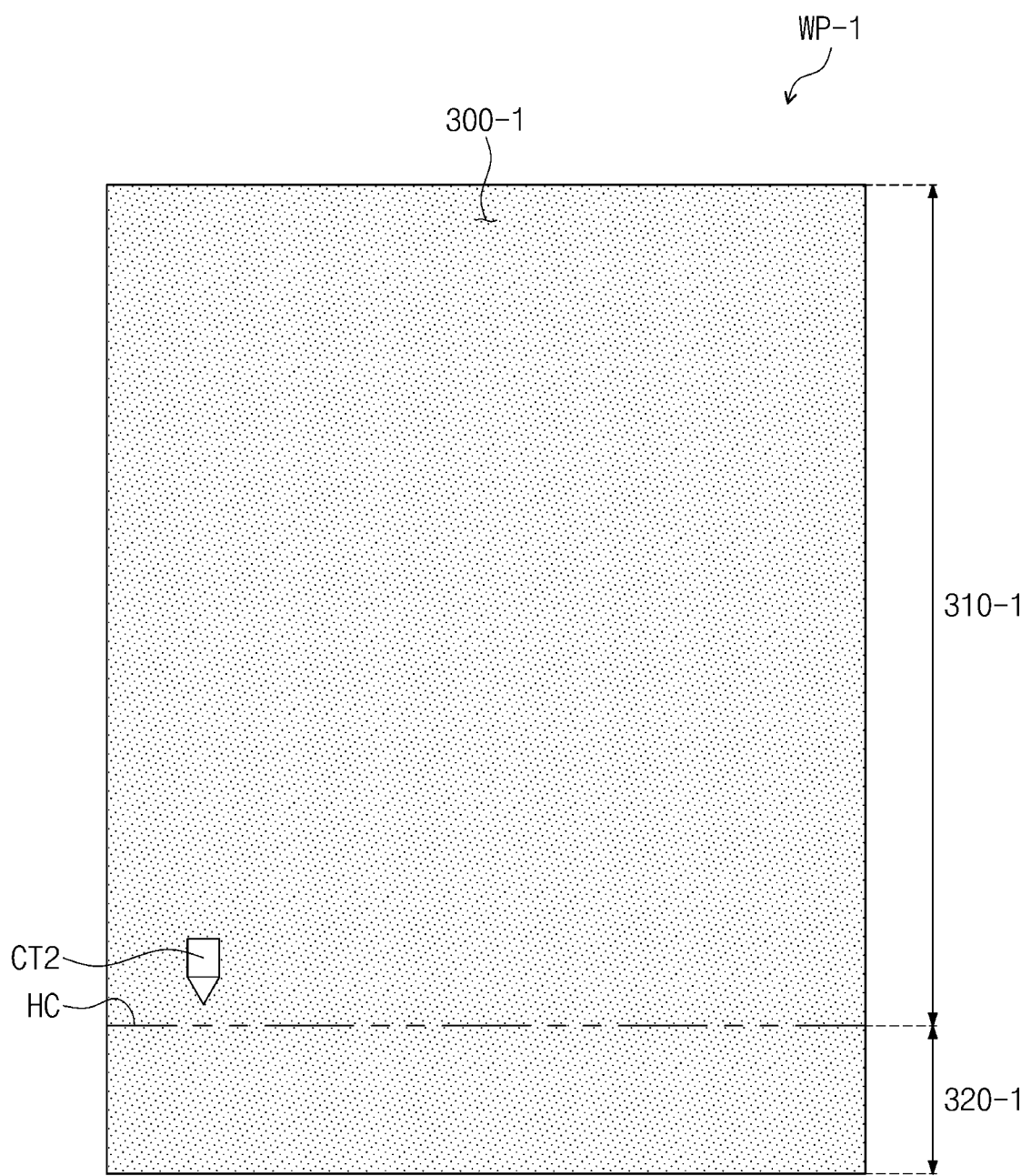
FIG. 7 is a plan view of a display panel on which a cutting line is formed according to an embodiment of the inventive concept.

FIG. 7 is a plan view of a display panel on which a cutting line is formed according to an embodiment of the inventive concept.

A cutting line HC is formed along a boundary between a display film area 310-1 and a pad film area 320-1. The cutting line HC is formed by using a second device CT2. In an embodiment, the second device may use the same equipment as that of the first device CT1. Here, an intensity of the laser may be adjusted to adjust a depth of a surface to be cut. The cutting line HC may be a reference line of an area that is an object to be delaminated in a following delamination process.

Figure 8:
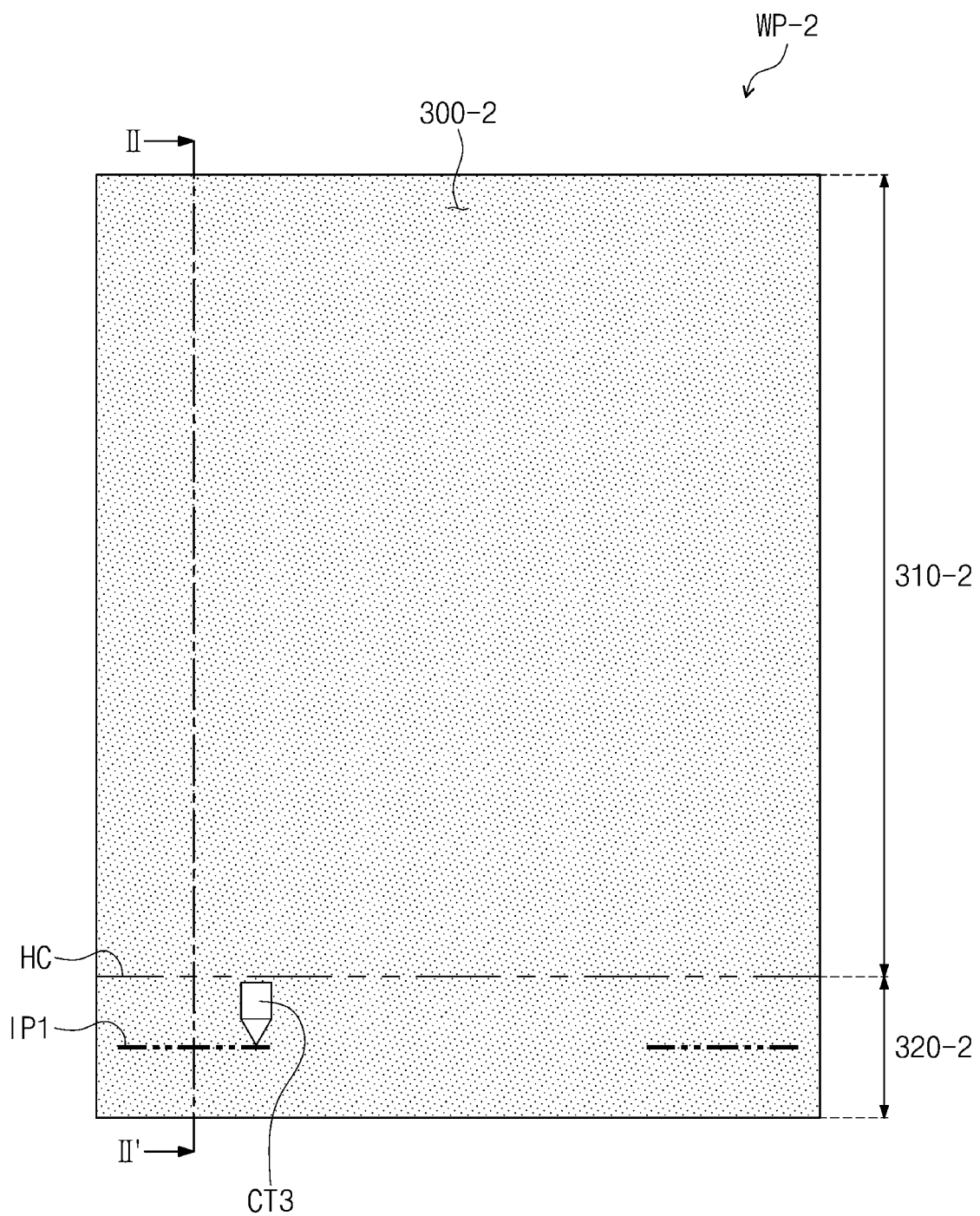
FIG. 8 is a plan view of a display panel on which an inspection pattern is formed according to an embodiment of the inventive concept.
Figure 9:
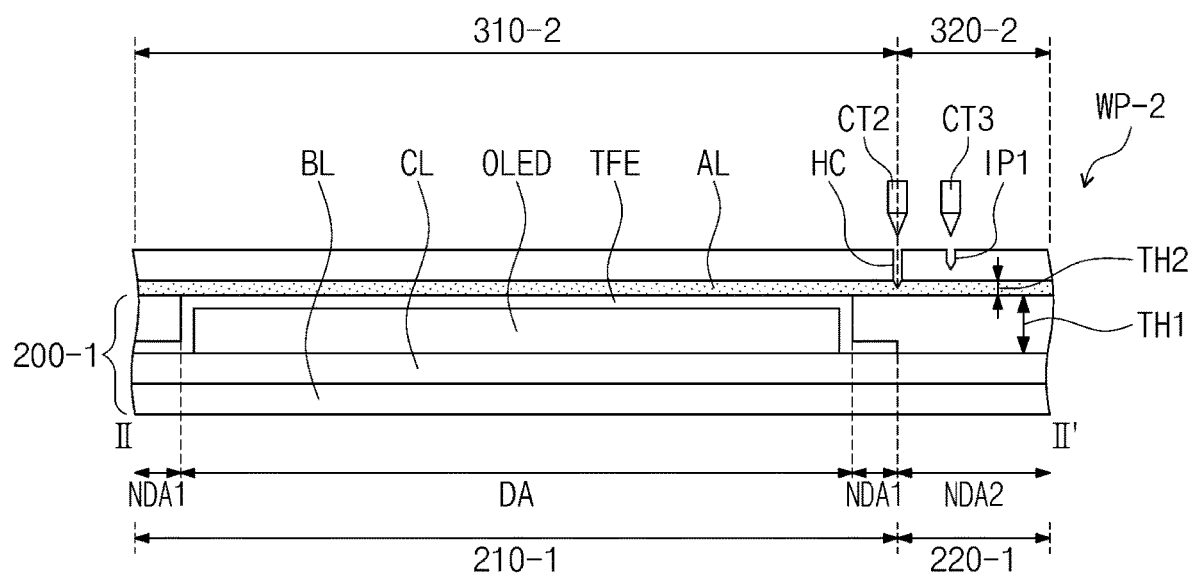
FIG. 9 is a cross-sectional view of a display panel on which a cutting line and an inspection pattern are formed, taken along the line II-II' of FIG. 8, according to an embodiment of the inventive concept.

FIG. 8 is a plan view of a display panel on which an inspection pattern is formed according to an embodiment of the inventive concept; and FIG. 9 is a cross-sectional view of a display panel on which a cutting line and an inspection pattern are formed, taken along the line II-II' of FIG. 8, according to an embodiment of the inventive concept. The same reference numerals are assigned to the same components as those in FIGS. 1 to 5, and a duplicate description will be omitted. Herein, a cutting line HC and a cut cross-section of an inspection pattern IP1 will be described in further detail with reference to FIGS. 8 and 9.

The inspection pattern IP1 is formed by removing a portion of a protective film unit 300-2 in a display panel WP-2 in a thickness direction. In the protective film unit 300-2, a cutting line HC is formed along a boundary between a display film area 310-2 and the pad film area 320-2. For example, the inspection pattern IP1 may be formed in plurality in the pad film area 320-2, and, in an embodiment, the inspection pattern IP1 may be formed in one portion of the pad film area 320-2. Also, the inspection pattern IP1 may have any of various shapes. Although not shown, in an embodiment, the inspection pattern IP1 may have a scratch shape, as an example, and may be formed in one portion of the display panel WP-2 in a direction of a long side or a short side of the display panel WP-2. The inspection pattern IP1 is used to inspect whether delamination has succeeded after the delamination process. In an embodiment, the inspection pattern IP1 is formed by using a third device CT3. In an embodiment, the third device may use the same equipment as that of the first device CT1. Here, an intensity of the laser may be adjusted to adjust a depth of a surface to be cut. Although the shape of the inspection pattern IP1 may include various embodiments, an embodiment of the inventive concept is not limited thereto.

The cutting line HC allows the protective film unit 300-2 to be completely removed in a thickness direction of the display panel WP-2 such that a portion of the adhesive layer AL disposed between an uppermost layer of the display panel WP-2 and the protective film unit 300-2 is exposed to the outside. In an embodiment, the adhesive layer AL remains in a portion on which the cutting line HC is formed and has a thickness of about 25 µm to about 40 µm. When the adhesive layer AL remaining after the cutting line HC is formed has a thickness less than about 25 µm, the protective film unit 300-2 may be detached before the delamination process, and moisture or foreign substances may be introduced. When the adhesive layer AL remaining has a thickness greater than about 40 µm, delamination failure due to an adhesion force may be prevented from being generated.

In an embodiment, the protective film unit 300-2 remaining after the inspection pattern IP1 is formed may have a thickness of about 25 µm to about 40 µm. When the remaining protective film unit 300-2 has a thickness less than about 25 µm, the protective film unit 300-2 around the inspection pattern IP1 may be prevented from being detached. When the remaining protective film unit 300-2 has a thickness greater than about 40 µm, an error, which is generated when checking whether the inspection pattern IP1 exists due to a small thickness of the inspection pattern IP1 in a following process of checking whether the inspection pattern exists, may be prevented.

Figure 10:
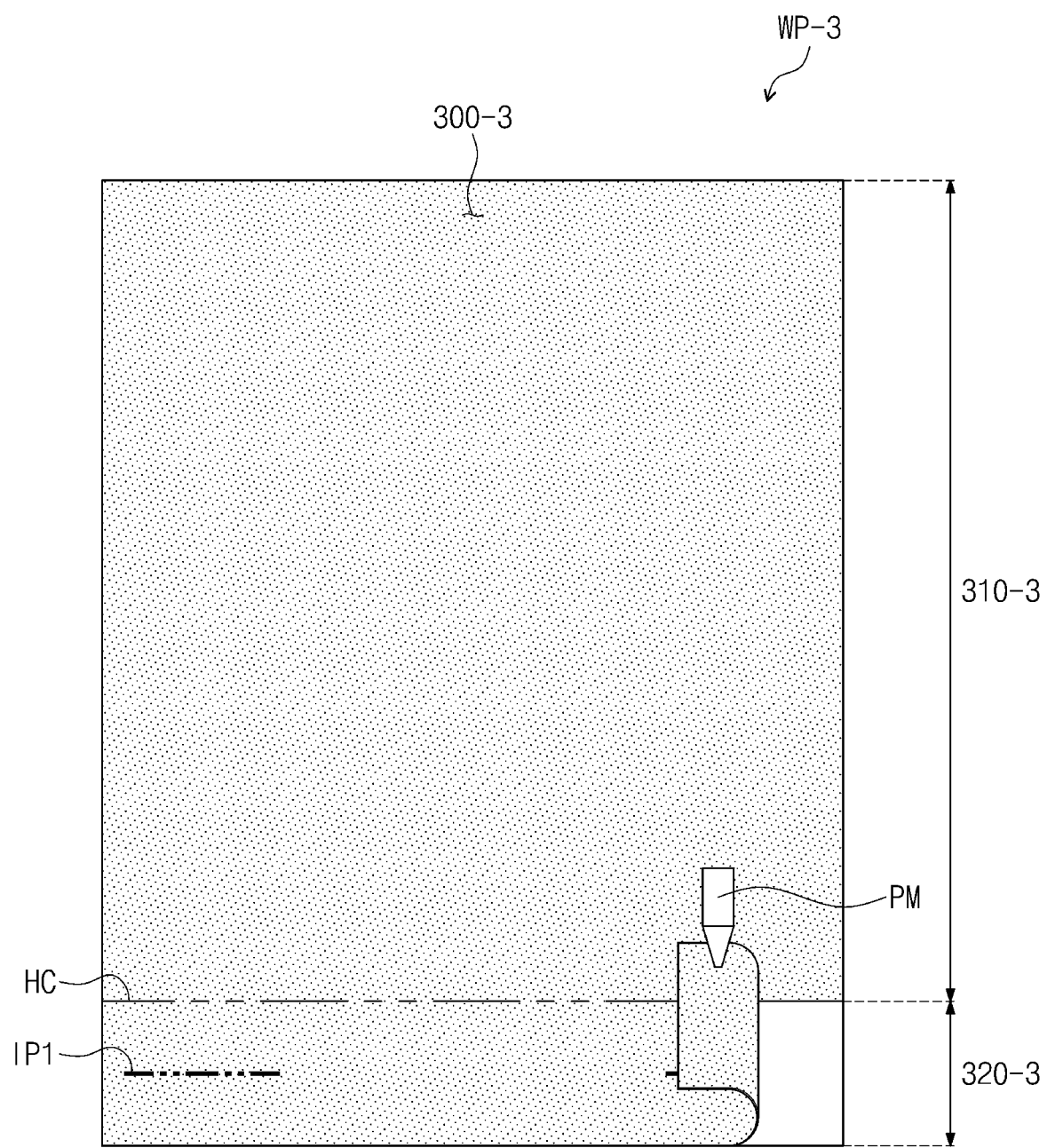
FIG. 10 is a plan view illustrating a process of delaminating a pad area portion of a display panel according to an embodiment of the inventive concept.

FIG. 10 is a plan view illustrating a process of delaminating showing a step of peeling off the corresponding protective film of the pad region portion of a display panel WP-3. The same reference numerals are assigned to the same components as those in FIG. 1 to FIG. 5, and redundant description is omitted.

The process of delaminating the display panel WP-3 uses a delamination device PM. An object to be delaminated is a pad film area 320-3 portion. In a protective film unit 300-3, a cutting line HC is formed along a boundary between a display film area 310-3 and the pad film area 320-3. Although not shown, the delamination device PM may weaken an adhesion force of an edge of the object to be delaminated so as to reduce a failure probability of the delamination work before the delamination process is performed. In an embodiment, for example, the edge of the object to be delaminated may be struck to weaken the adhesion force of the adhesive layer AL, and, then, the delamination process may be performed. Although the delamination device PM may include any of various embodiments, such as a delamination device using a roller and a delamination device using a grip, an embodiment of the inventive concept is not limited thereto.

Figure 11:
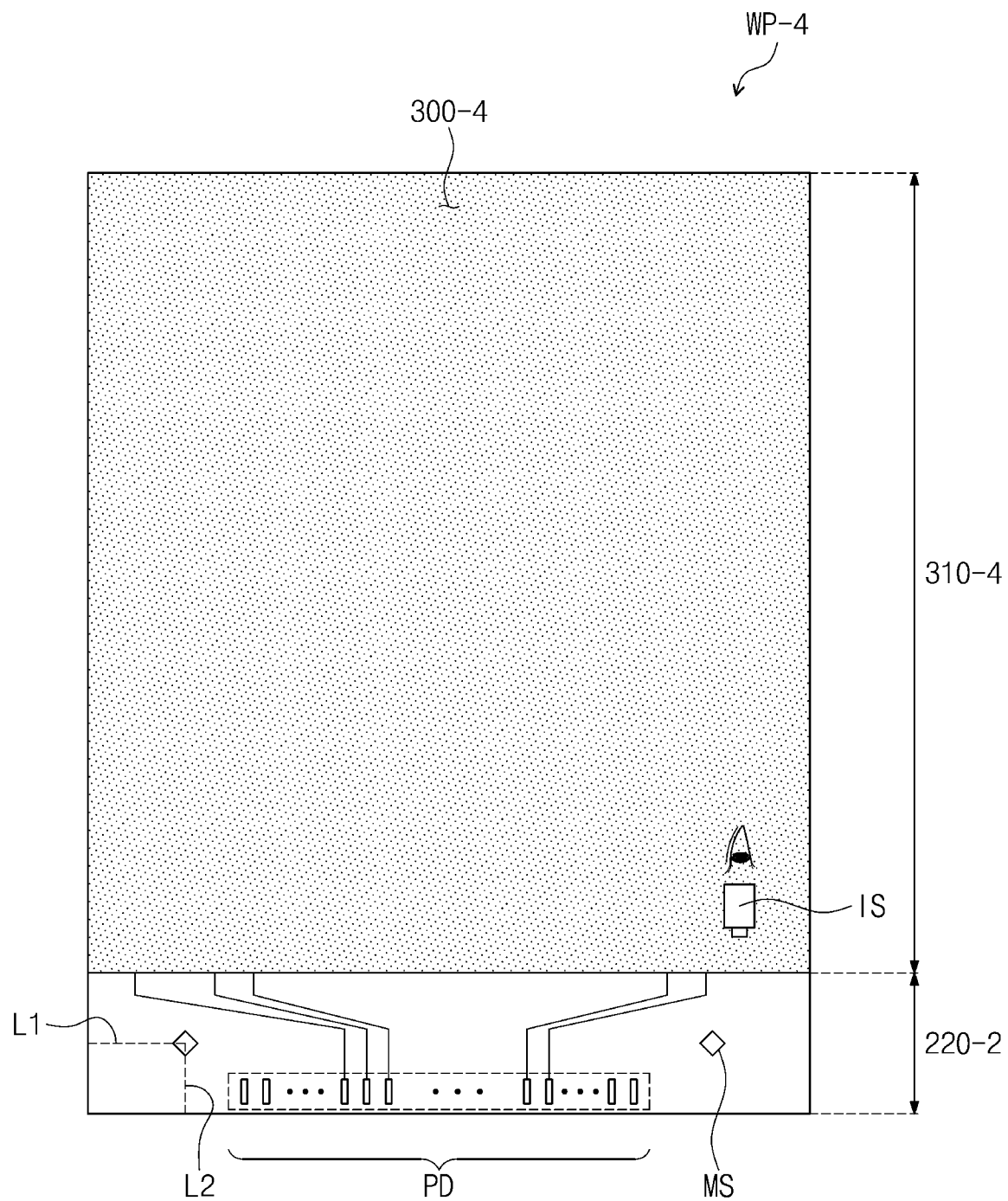
FIG. 11 is a plan view illustrating a process of checking whether an inspection pattern exists according to an embodiment of the inventive concept.

Referring to FIG. 11, a process of checking whether the inspection pattern exists after the process of delaminating the pad film area portion 320-3 (see FIG. 10) corresponding to the pad area 220-2 of a display panel WP-4 is performed. The process of checking whether the inspection pattern IP1 exists is performed to check whether the delamination has succeeded, and an inspection device IS is used for the process. In an embodiment, the inspection device IS may include a camera module and an alignment mark recognition module. The inspection device IS may distinguish whether the object to be delaminated is delaminated by the naked eye of an inspector through the camera module. That is, in a protective film unit 300-4 including a display film area 310-4, a pad film area corresponding to the pad film area 320-3 (see FIG. 10) on which the inspection pattern IP1 is formed is the object to be delaminated, and the inspection pattern IP1 formed by removing protect film may not be distinguished by the naked eye when the delamination is successively performed. When the delamination is successively performed, the wires SGL, the pads PD, and the alignment mark MS are exposed to the outside.

When the delamination has failed, the inspection pattern IP1 may be observed while the inspection is performed. When the delamination has failed, the delamination process may be re-performed.

When the delamination process is successively performed, the alignment mark MS exposed to the outside in the pad area 220-2 may be recognized through the alignment mark recognition module of the inspection device IS. A process of checking whether the display units are cut by a desired number in the process of separating the plurality of display units through the recognition of the alignment mark MS may be included. For example, the alignment mark MS has a first distance L1 and a second distance L2, respectively, from a long side and a short side of the display unit 200. The alignment mark MS may be measured by the alignment mark recognition module of the inspection device IS, and, then, the display unit 200 may be determined as a qualified product when the first distance L1 and the second distance L2 are within an error range (e.g., a preset error range). When deviated from the error range, the display unit may be determined as a failure.

According to an embodiment of the inventive concept, as the inspection device IS that is the same equipment is used, the process of checking whether the delamination has succeeded and the process of measuring the lengths of the long side and the short side of the display unit may be performed at the same time. Whether the delamination has succeed may be determined by checking whether the inspection pattern IP1 is observed through the camera module of the inspection device IS, and, when the inspection pattern IP1 is removed, the lengths of the long and short sides of the display unit 200 from the alignment mark MS may be measured through the alignment mark recognition module of the inspection device IS. The above process may be performed through module change of the inspector in the same process using the inspection device IS that is the same equipment.

Typically, the process of inspecting whether the delamination has succeeded is performed by a contact-type inspection using a method of pressing the pad area. Since the contact-type inspection is performed by operating the equipment in a nanometer range, the equipment contacts the pad area to generate a crack due to an error of the equipment during the inspection process.

According to an embodiment of the inventive concept, the process of inspecting whether the inspection pattern IP1 exists and the process of measuring the lengths of the long and short sides of the display unit 200 may be performed at the same time by using the inspection device IS that is the same equipment. As the typical contact-type inspection is changed to the non-contact-type inspection in the above-described process by using the same equipment, reduction in production yield due to the crack generation may be avoided.

Figure 12A:
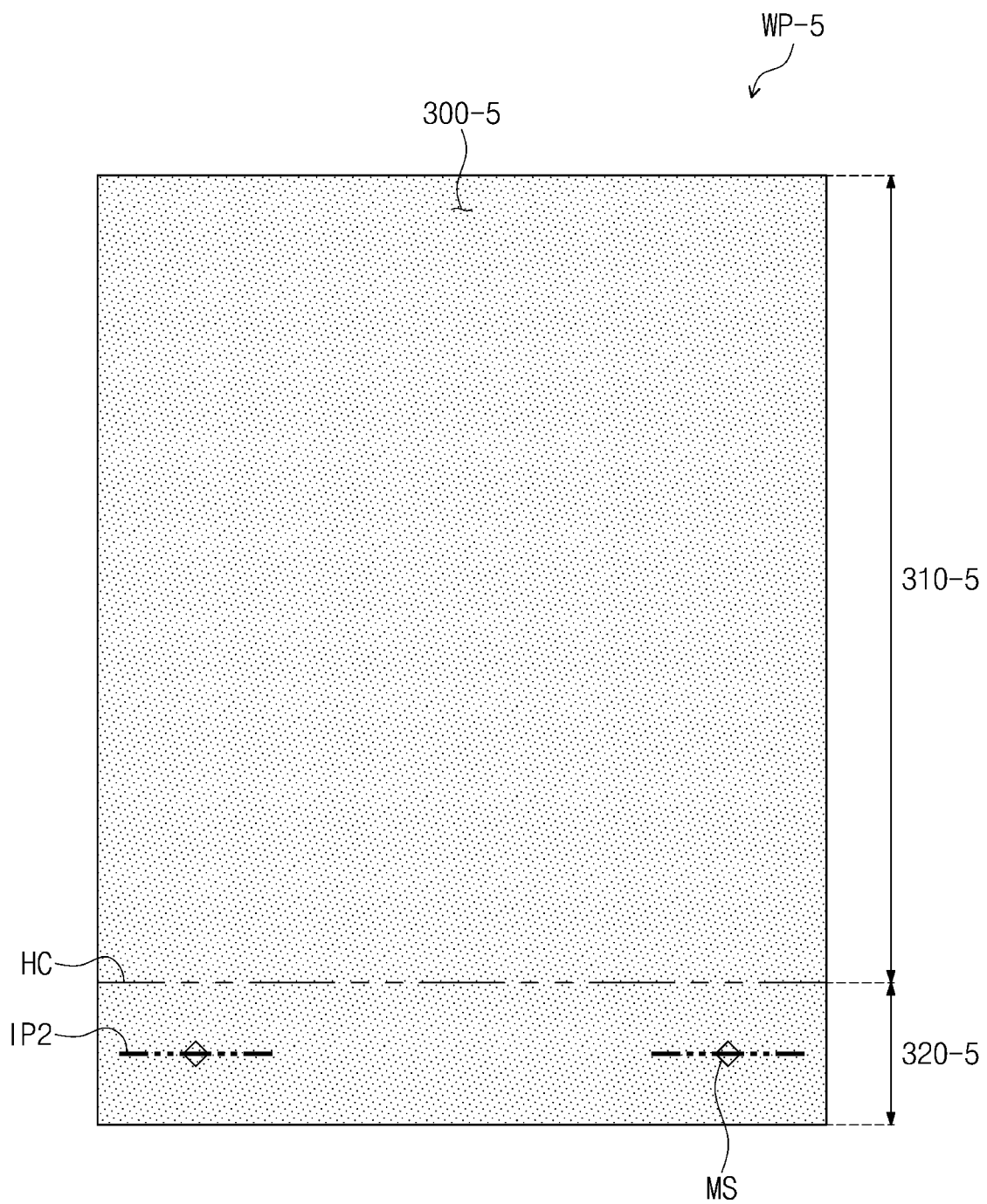
FIGS. 12A and 12B are plan views illustrating an inspection pattern according to an embodiment of the present invention.
Figure 12B:
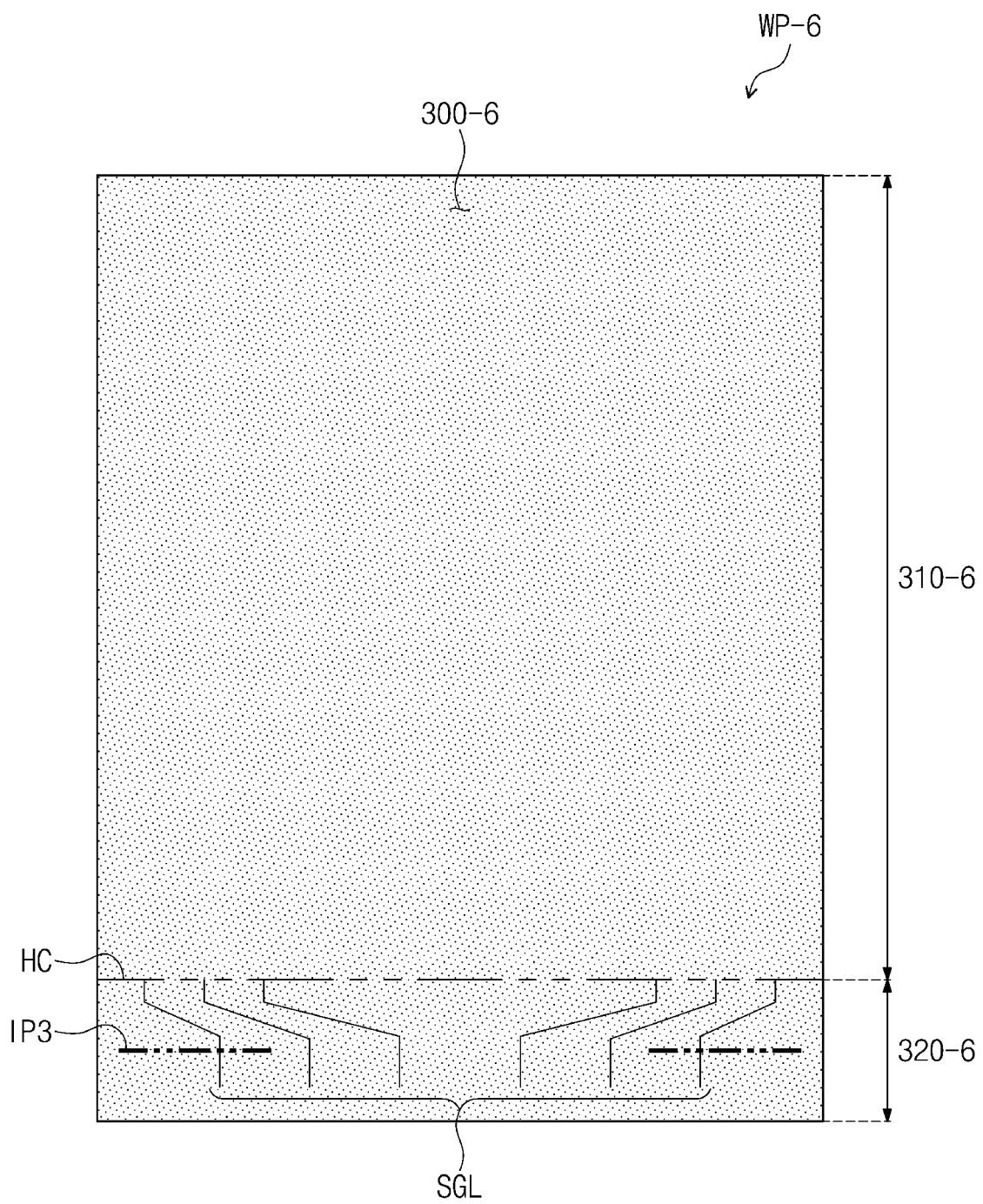

FIGS. 12A and 12B are plan views illustrating an inspection pattern according to an embodiment of the present invention.

In an embodiment, an inspection pattern IP2 may be formed on a protective film unit 300-5 corresponding to a pad film area 320-5 by overlapping at least one alignment mark MS of the plurality of alignment marks formed on the pad area 220 (see FIG. 2). In the protective film unit 300-5, a cutting line HC is formed along a boundary between a display film area 310-5 and the pad film area 320-5. In an embodiment, a process of inspecting whether the inspection pattern IP2 exists and a process of measuring lengths to the long and short sides of the display unit 200 (see FIG. 2) are performed at the same time and, as the alignment mark MS and the inspection pattern IP2 overlap each other, a process time may be reduced, and existence of the inspection pattern IP2 may be further intuitionally checked.

In an embodiment, an inspection pattern IP3 may be formed on the protective film unit 300-5 corresponding to the pad film area 320-5 by overlapping at least one wire of the plurality of wires SGL formed on the pad area 220 (see FIG. 2). In an embodiment, a process of inspecting whether the inspection pattern IP3 exists and a process of checking whether the wires SGL are failed are performed at the same time by overlapping the alignment mark MS with the wires SGL, and the above-described effect may be achieved. Positions at which the inspection patterns are formed may include any of various embodiments on the protective film unit 300-5 corresponding to the pad film area 320-5, and an embodiment of the inventive concept is not limited thereto.

As described above, although a method for manufacturing the display device by using the work substrate 100 (see FIG. 1) is described, an embodiment of the inventive concept is not limited thereto. According to an embodiment of the inventive concept, the display device may be manufactured by using the display unit 200 (see FIG. 2) cut from the work substrate 100. Description of components corresponding to those in FIGS. 2, 7, and 8 will not be provided, and like reference numerals in the drawings denote like elements.

According to an embodiment of the inventive concept, a method for manufacturing a display device may include: a process of providing a display unit 200 including a display area 210 and a pad area 220; a process of attaching a protective film unit including a display film area 310 and a pad film area 320 in correspondence to the display area 210 and the pad area 220 onto the provided display unit 200; a process of forming a cutting line so as to correspond to a boundary between the display film area 310 and the pad film area 320; a process of forming an inspection pattern that is partially removed in a thickness direction of a protective film unit 300-1 on the pad film area 320 of the protective film unit 300-1, a process of delaminating the protective film unit 300-1 corresponding to the pad film area 320 along a cutting line; and a process of checking whether an inspection pattern exists on the pad area.

Figure 13:
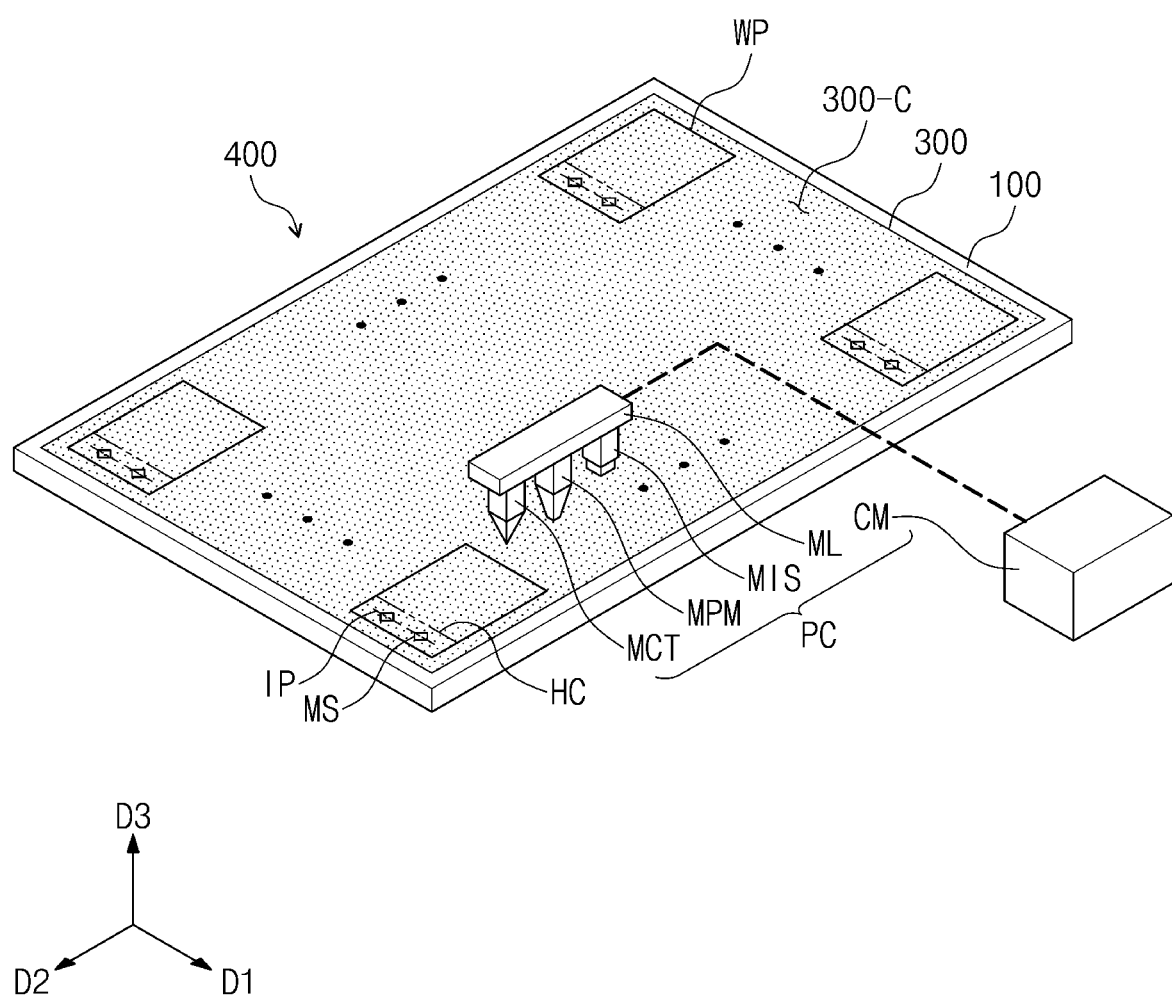
FIG. 13 is a perspective view illustrating equipment for manufacturing a display device according to an embodiment of the inventive concept.

FIG. 13 is a perspective view illustrating equipment for manufacturing a display device according to an embodiment of the inventive concept. Description of components corresponding to those in FIGS. 1, 4, and 8 will not be provided, and like reference numerals in the drawings denote like elements.

Display device manufacturing equipment PC, according to an embodiment, includes a main body ML, a laser device MCT, a delamination device MPM, an inspection device MIS, and a control device CM. The laser device MCT, the delamination device MPM, and the inspection device MIS may be coupled to the main body ML. The laser device MCT may cut the work panel 400 and separate it into a plurality of display panels. Each of the display panels WP includes a protective film unit superimposed on and attached to the display unit and the display unit. In an embodiment, while the display device manufacturing equipment PC for dividing the work panel 400 into the display panel WP moves on the work panel 400 in a first direction D1 and a second direction D2 (the first direction D1 and the second direction D2 intersect a third direction D3), a laser is irradiated along an edge of the plurality of display panel WP and passes through a bottom surface of the work panel 400, such that the work panel 400 is divided. In an embodiment, the laser device MCT may entirely remove a protective film unit 300-1 (see FIG. 4) at a boundary between a display film area 310 (see FIG. 4) and a pad film area 320 (see FIG. 4) in a thickness direction to form a cutting line HC. Also, the laser device MCT may form an inspection pattern IP, from which a portion is removed in a thickness direction, on a portion of the pad film area 320. The laser device MCT may irradiate a laser having various intensity. Accordingly, cutting lines having thicknesses different from each other may be formed.

The delamination device MPM removes the pad film area 320 that is an object to be delaminated along the cutting line HC. In an embodiment, although not shown, the delamination device MPM may weaken an adhesion force of an edge of the object to be delaminated so as to reduce a failure probability of the delamination work before the delamination process is performed. For example, the edge of the object to be delaminated may be struck to weaken the adhesion force of an adhesive layer AL (see FIG. 5), and, then, the delamination process may be performed. Although the delamination device MPM may include any of various embodiments, such as a delamination device using a roller and a delamination device using a grip, an embodiment of the inventive concept is not limited thereto.

In an embodiment, the inspection device MIS may include a camera module and an alignment mark recognition module. The inspection device MIS may distinguish whether the object to be delaminated is delaminated by the naked eye of an inspector through the camera module. That is, when the delamination is successively performed by the delamination device MPM, the inspection pattern IP may not be distinguished by the naked eye. When the delamination has failed, the inspection pattern IP may be observed, and re-delamination may be performed by the delamination device MPM.

When the delamination process is successively performed, an alignment mark MS exposed to the outside from a pad area 220-2 (see FIG. 11) may be recognized through the alignment mark recognition module of the inspection device MIS. Whether the plurality of display units are cut by a desired number in the process of separating the plurality of display units may be checked through the recognition of the alignment mark MS.

In an embodiment, the control device CM may be electrically connected to the laser device MCT, the delamination device MPM, and the inspection device MIS through the main body ML. In an embodiment, the control device CM may adjust an intensity of a wavelength and an irradiation time to adjust the laser to have a desired intensity. The control device CM may control whether the pad film area 320 is delaminated after the laser irradiation. Also, the control device CM may perform a process of checking whether the delamination has succeeded by controlling the camera module and the alignment mark recognition module of the inspection device MIS and whether the display units are cut by a desired number through the alignment mark MS recognition.

The display device manufacturing equipment PC according to an embodiment of the inventive concept may perform the laser irradiation, the delamination, and the inspection of each process by using the same equipment. Thus, a manufacturing process time may be shortened in comparison to a time required when different equipment is used for each process, and, thus, productivity may be improved.

As described above, in the process of inspecting whether the delamination is performed after the process of delamination of the pad area, whether the delamination is performed may be inspected in a non-contact manner instead of the typical contact-type inspection by using the pressing method. Thus, the components mounted inside, such as the pad and the wire that are disposed below the protective film, may be prevented or substantially prevented from being damaged.

Although some exemplary embodiments of the present invention have been described, it is to be understood that the present invention should not be limited to these exemplary embodiments, but various changes and modifications can be made by one of ordinary skill in the art within the spirit and scope of the present invention as herein claimed.

What is claimed is:

1. A method for manufacturing a display device, the method comprising:
    providing a work panel comprising a work substrate comprising a plurality of display units each comprising a display area and a pad area, and a work protective film attached onto the work substrate;
    forming a cutting line in the work protective film so as to correspond to a boundary between the display area and the pad area and along a thickness direction of the work protective film;
    forming an inspection pattern by partially removing the work protective film along the thickness direction of the work protective film overlapping the pad area;
    cutting the work panel to separate into the display units;
    delaminating the work protective film overlapping the pad area in the display units; and
    checking whether the inspection pattern exists in the pad area of the display units.

2. The method of claim 1, wherein the pad area comprises a plurality of wires and a plurality of alignment marks, and
    the inspection pattern overlaps at least one of the plurality of alignment marks.

3. The method of claim 2, wherein the inspection pattern overlaps at least one of the plurality of wires.

4. The method of claim 2, wherein the plurality of alignment marks is formed on a same layer as that of a wire of the plurality of wires.

5. The method of claim 2, further comprising measuring distances from an alignment mark of the plurality of alignment marks to each of a long side and a short side of the display unit.

6. The method of claim 5, wherein measuring distances from the alignment mark to each of the long side and the short side of the display unit and checking whether the inspection pattern exists are performed at the same time.

7. The method of claim 1, wherein an adhesive layer is between the work panel and the work protective film, and
    wherein the cutting line is formed by completely removing the work protective film in the thickness direction of the work protective film along the boundary between the display area and the pad area and exposing the adhesive layer to the outside.

8. The method of claim 7, wherein a thickness in the adhesive layer overlapping the cutting line is 25 μm to about 40 μm.

9. The method of claim 1, wherein each of the display units comprises a base substrate, a circuit element layer, a display element layer, and a thin-film encapsulation layer, which are sequentially laminated.

10. A method for manufacturing a display device, the method comprising:
    providing a work panel comprising a work substrate comprising a plurality of display units each comprising a display area and a pad area, a work protective film on the work panel, and an adhesive member disposed between the work panel and the work protective film to bond the work panel and the work protective film;
    forming a cutting line in the work protective film so as to correspond to a boundary between the display area and the pad area;
    forming an inspection pattern in the work protective film overlapping the pad area; and
    cutting the work panel to separate into the display units,
    wherein the cutting line is formed by completely removing the work protective film in a thickness direction of the work protective film along the boundary between the display area and the pad area and exposing the adhesive member to the outside, and the inspection pattern is formed by partially removing the work protective film in the thickness direction of the work protective film.

11. The method of claim 10, further comprising delaminating the work protective film overlapping the pad area in the display units; and
    checking whether the inspection pattern exists in the pad area of the display units.

12. The method of claim 11, wherein the pad area comprises a plurality of wires and a plurality of alignment marks, and
    the inspection pattern overlaps at least one of the plurality of alignment marks.

13. The method of claim 12, wherein the inspection pattern overlaps at least one of the plurality of wires.

14. The method of claim 12, wherein the plurality of alignment marks is formed on a same layer as that of a wire of the plurality of wires.

15. The method of claim 12, further comprising measuring distances from an alignment mark of the plurality of alignment marks to each of a long side and a short side of the display unit.

16. The method of claim 11, wherein a thickness in the adhesive member overlapping the cutting line is 25 μm to about 40 μm.

* * * * *